United States Patent [19]
Weber

[11] Patent Number: 5,929,522
[45] Date of Patent: Jul. 27, 1999

[54] SEMICONDUCTOR NON-LAMINATE PACKAGE AND METHOD

[75] Inventor: Patrick O. Weber, San Jose, Calif.

[73] Assignee: Hestia Technologies, Inc., Santa Clara, Calif.

[21] Appl. No.: 09/061,270

[22] Filed: Apr. 17, 1998

[51] Int. Cl.$^6$ .......................... H01L 23/48; H01L 23/52; H01L 29/40
[52] U.S. Cl. .......................... 257/738; 257/693; 257/793; 257/795; 257/789
[58] Field of Search ..................... 257/693, 738, 257/793, 795, 789; 228/180.22

[56] References Cited

U.S. PATENT DOCUMENTS

| | | | |
|---|---|---|---|
| 4,807,021 | 2/1989 | Okumura | 257/738 |
| 5,166,773 | 11/1992 | Temple et al. | 257/678 |
| 5,216,278 | 6/1993 | Lin et al. | |
| 5,293,072 | 3/1994 | Tsuji et al. | 257/738 |
| 5,583,376 | 12/1996 | Sickler et al. | 257/698 |
| 5,777,382 | 7/1998 | Abbott et al. | 257/738 |

FOREIGN PATENT DOCUMENTS

0582051  2/1994  European Pat. Off. ............... 257/693

*Primary Examiner*—Mahshid Saadat
*Assistant Examiner*—Jhihan B. Clark
*Attorney, Agent, or Firm*—Burns, Doane, Swecker & Mathis LLP

[57] ABSTRACT

A semiconductor device package includes a carrier substrate molded of a non-laminate material. A plurality of conductive metal balls are molded within the non-laminate carrier substrate to provide an electrical connection between opposite sides of the substrate. The conductive metal balls provide conductive columns through the substrate for electrically connecting a chip mounted on one side of the substrate to solder balls on an opposite side of the substrate for mounting the package on a printed circuit board. The conductive columns eliminate the need for via holes which are used in known packages. The package with conductive columns provides a more compact, more precise, and lower cost package which is less susceptible to moisture damage than the known packages employing via holes.

11 Claims, 10 Drawing Sheets

SEMICONDUCTOR NON-LAMINATE PACKAGE AND METHOD

BACKGROUND OF THE INVENTION

1. Field of the Invention

The present invention relates to semiconductor devices, and more particularly, to a non-laminate semiconductor package and method of forming a non-laminate semiconductor package.

2. Description of the Related Art

Current technology for the fabrication of semiconductor integrated circuit chip packages involves the use of a laminate materials such as glass fibers impregnated with a resin material such as BT (bismaleimide triazne), polyimide resins, or other organic resins. This type of conventional integrated circuit package has a chip or die positioned on one side of the laminate substrate and leads and/or solder balls on an opposite side of the substrate. The two sides of the substrate are electrically connected to one another by plated holes extending through the substrate called via holes.

Figure 1:
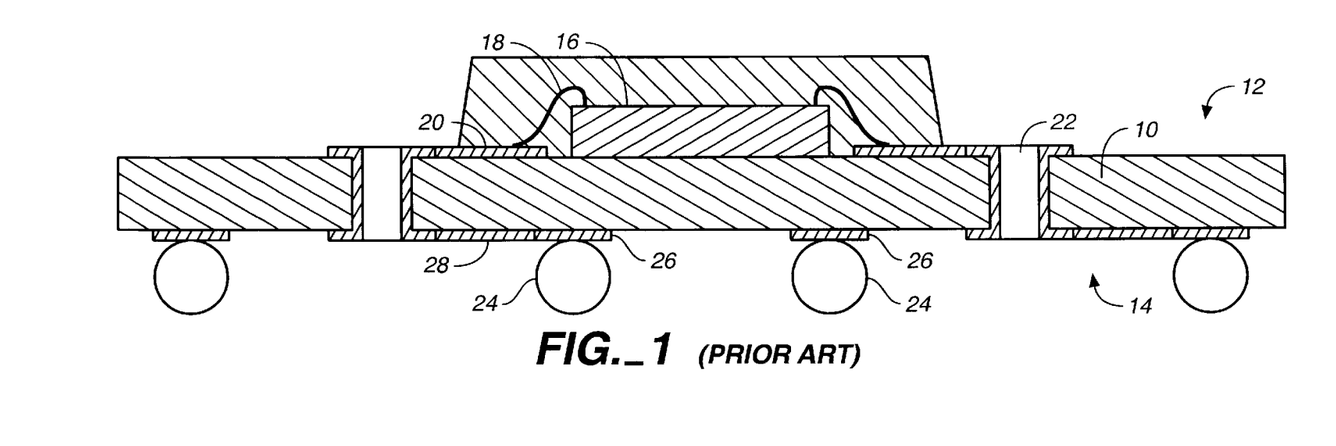
FIG. 1 is a side cross-sectional view of a standard ball grid array chip package according to the prior art.

One example of a known integrated circuit chip package is illustrated in FIG. 1. The package includes a laminate substrate 10 having a chip side 12 and an opposite mounting side 14. An integrated circuit chip 16 is mounted on the chip side 12 of the laminate substrate 10 and is connected by connecting wires 18 to a plurality of bond fingers 20 on the substrate. The bond fingers 20 are electrically connected to a plurality of via holes 22 which extend through the substrate 10 and electrically interconnect the chip side 12 of the substrate to the mounting side 14 of the substrate. On the mounting side 14 of the substrate 10, a plurality of solder balls 24 are positioned on solder pads 26 electrically connected to the via holes 22 by traces 28.

The via holes 22 used in the known integrated circuit chip packages are formed by drilling holes through the laminate substrate 10 and plating the holes with a conductive material such as copper. This method of forming the via holes 22 is both time-consuming and expensive. Thus, it would be desirable to replace the via holes 22 with a simpler and less expensive structure.

In addition, the laminate substrate 10 of the prior art generally includes about 40% glass fiber filler and about 60% resin. The large percentage of resin allows the laminate material to absorb moisture. The absorption of moisture causes substrate swelling and delamination of the components. In order to address the problems of moisture absorption and delamination, laminate substrates are preconditioned prior to use by exposure to moisture and heat for a substantial period of time, such as one week. This preconditioning process is both expensive and time-consuming.

Figure 2:
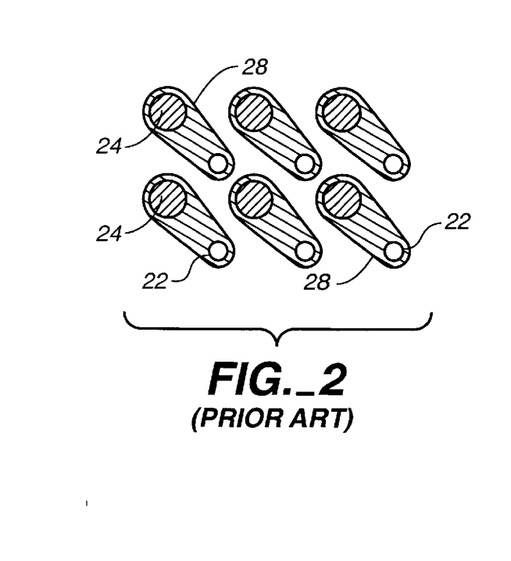
FIG. 2 is a bottom view of a portion of the package of FIG. 1 according to the prior art.
Figure 3:
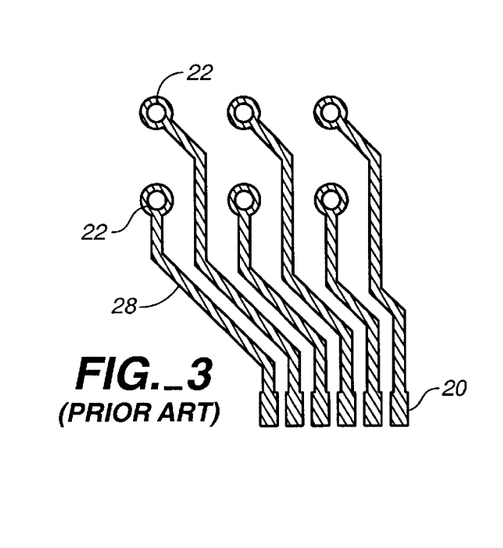
FIG. 3 is a top view of a portion of the package of FIG. 1 according to the prior art.
Figure 4:
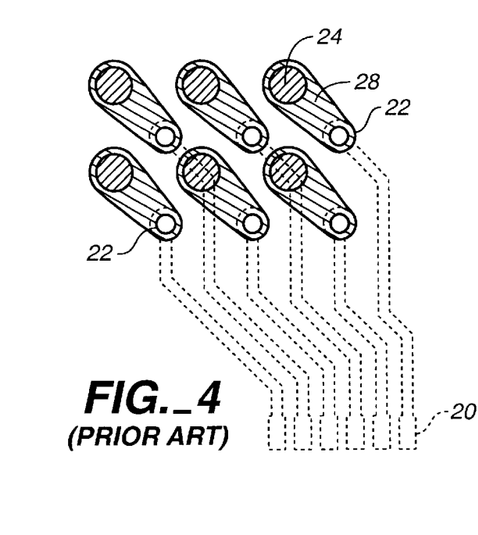
FIG. 4 is a superimposed view showing the relative positions of the top and bottom views of FIGS. 2 and 3.

In semiconductor chip fabrication, there is a continuing need to reduce package size while increasing electrical and thermal performance of the packages. The use of the via holes 22 in the known semiconductor chip package unnecessarily increases the overall size of the package because no traces or solder pads can be positioned at the locations of the via holes. For example, FIG. 2 illustrates a portion of a mounting side 14 of a known package having a plurality of solder balls 24, connected by traces 28 to the via holes 22 for electrical interconnection to the chip side 12 of the substrate. FIG. 3 illustrates the chip mounting side 12 of the package having a plurality traces 28 connecting the via holes 22 to the bond fingers 20. FIG. 4 shows the mounting side 14 superimposed on the chip side 12 with the chip side shown in hidden lines. As shown in FIG. 4, the solder balls 24 must be displaced from the via holes 22 and connected by traces, increasing the overall size of the package. Accordingly, it would be desirable to reduce the package size by moving the solder balls 24 closer to or directly over the via holes 22.

Another drawback of the known single sided and double sided semiconductor chip packages is the undercutting of the sides of the traces 28 and the solder pads 26 which occurs during etching due to the method in which the packages are produced.

Figure 5A:
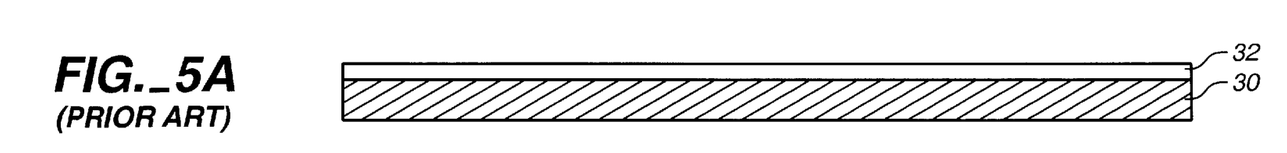
FIGS. 5A–5E are side cross-sectional views of the steps of a process for formation of a ball grid array chip package according to the prior art.
Figure 5B:
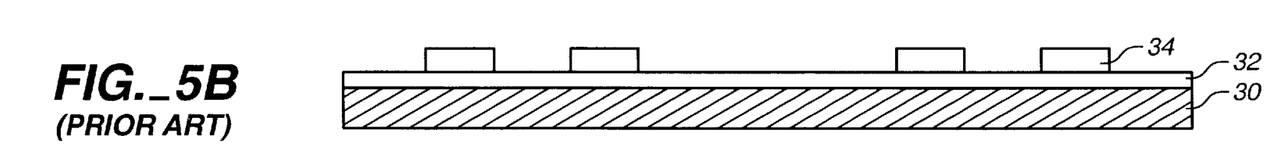
Figure 5C:
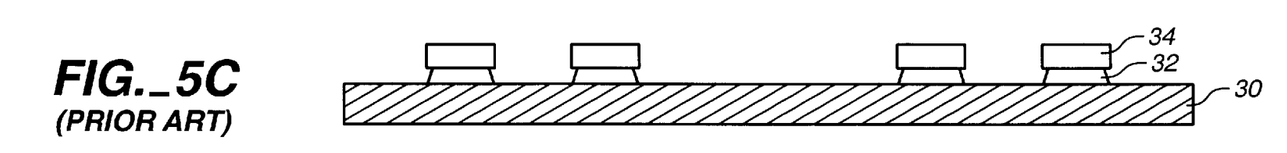
Figure 5D:
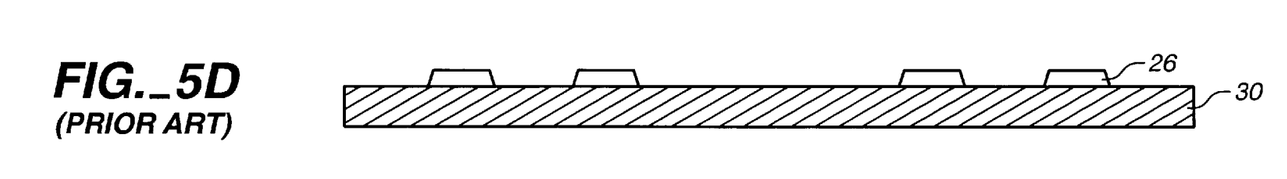
Figure 5E:
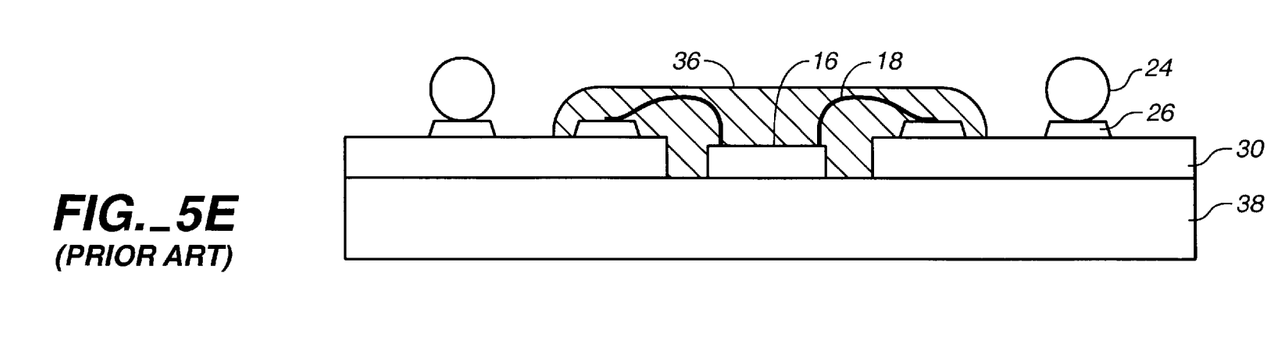

The prior art chip packages are generally produced by a method such as the one illustrated in FIGS. 5A through 5E. The method of FIGS. 5A through 5E shows the formation of a single-sided substrate. The method includes the steps of providing a kapton tape carrier of polyamide 30 with a layer of copper foil 32 on one side as shown in FIG. 5A. As shown in FIG. 5B, a photo resist dry film 34 is laminated onto the surface of the copper foil 32 in a pattern in the shape of the various traces and pads to be formed in the copper foil. Alternatively, the photo resist pattern could be screen printed or the surface can be coated with a wet photo resist and dried. The copper foil 32 is then etched, as shown in FIG. 5C by a conventional etching process. However, the etching process tends to slightly undercut the copper material beneath the photo resist 34 providing angled sides of the traces and solder pads. The photo resist 34 is then striped from the copper traces and solder pads as illustrated in FIG. 5D resulting in a carrier 30 having a plurality of copper traces 28 and solder pads 26. Finally, the carrier 30 is mounted on a base 38 and a chip 16 is attached. The chip 16 may be placed in a cavity in the carrier 30 or the base 38. The chip 16 is connected by wires 18 to the traces 28 and then encapsulated with a molding or potting material 36. Solder balls 24 are placed on the solder pads 26 for mounting the package in an inverted or flip chip orientation.

SUMMARY OF THE INVENTION

The present invention provides a semiconductor package which addresses many of the problems in the prior art. The semiconductor package according to the present invention provides a better product with finer lines at lower costs than existing packages. In addition, the present invention reduces moisture absorption which can cause delamination of the chip from the substrate. One aspect of the invention also reduces undesirable undercutting of traces and solder pads caused by etching.

In accordance with one aspect of the present invention, a semiconductor device includes a carrier substrate and a plurality of conductive metal balls molded within the carrier substrate. The carrier substrate has a first surface for attachment of a chip and a second surface opposite the first surface for mounting the carrier. The carrier is molded of a non-laminate material. The metal balls each provide an electrical connection between the first surface and the second surface of the carrier. A plurality of signal traces on the first surface are electrically connected to the metal balls and a plurality of solder pads on the second surface are electrically connected to the metal balls. A chip is mounted on the first surface and electrically connected to the plurality of signal traces.

According to another aspect of the present invention, a semiconductor package includes a carrier substrate having a first surface for attachment of a chip and a second surface opposite the first surface, and a plurality of conductive columns molded within the carrier substrate to provide an electrical connection between the first surface and the second surface. The carrier substrate is formed of a mold material and a chip mounted is on the first surface of the carrier substrate and electrically connected to the conductive columns. A plurality of connecting members on the second surface are electrically connected to the conductive columns for electrically mounting the package.

In accordance with a further aspect of the present invention, a method of forming a semiconductor package includes the steps of placing columns of conductive material between two sheets in a first mold tool; closing a second mold tool over the two sheets and columns; filling a space between the two sheets and around the columns with a mold material to form a substrate panel having the columns providing an electrical connection between first and second sides of the substrate panel; curing the mold material; removing the substrate panel from the mold; and mounting a semiconductor chip on the substrate panel.

In accordance with another further aspect of the present invention, a method of forming a semiconductor package by an additive process includes the steps of providing an etchable carrier sheet; applying a photo resist to the carrier sheet in a pattern which leaves spaces for formation of conductive pathways; applying a layer of conductive etch resistant material to the carrier sheet; applying a layer of conductive material over the etch resistant material layer to form the conductive pathways; stripping the photo resist; mounting a chip on the carrier sheet and electrically connecting the chip to the conductive pathways; encapsulating the chip and the conductive pathways with a mold material; and removing the carrier sheet by etching.

BRIEF DESCRIPTION OF THE DRAWINGS

The invention will now be described in greater detail with reference to preferred embodiments illustrated in the accompanying drawings, in which like elements bear like reference numerals, and wherein.

DETAILED DESCRIPTION OF THE PREFERRED EMBODIMENTS

Figure 6:
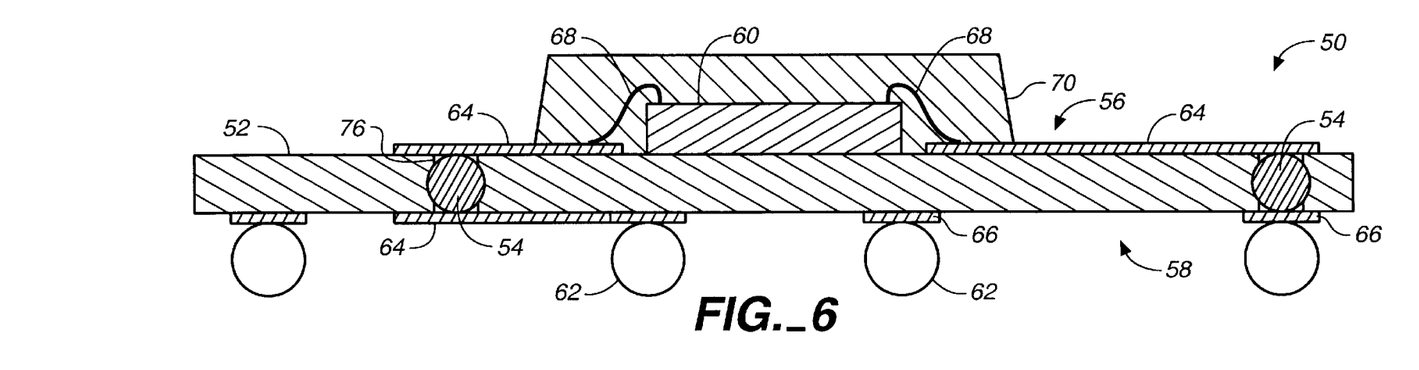
FIG. 6 is a side cross-sectional view of a first embodiment of a semiconductor chip package according to the present invention.

A first embodiment of a non-laminate semiconductor chip package 50 is illustrated in cross section in FIG. 6. The chip package 50 includes a mold material substrate 52 in which a plurality of high temperature metal balls 54 are embedded to provide electrical connections between an upper surface or chip side 56 of the substrate and a bottom surface or mounting side 58 of the substrate. The mold material substrate 52 is a non-laminate material including a low percentage of resin and a high percentage of filler material such as silica or quartz. This non-laminate mold material has lower moisture absorption than laminate materials due to the low percentage of resin.

Non-laminate materials are defined as a mold material in which filler particles are randomly dispersed and the filler content is at least 50%. Preferably, the filler content of the non-laminate mold material is 70% or greater.

The chip package 50 includes a plurality of signal traces 64 formed on the chip side 56 and a plurality of signal traces 64 and solder ball lands 66 formed on the mounting side 58 in a manner which will be described in detail below. A chip 60 is mounted on the chip side 56 of the substrate and interconnected by a plurality of wires 68 to the signal traces 64. The chip 60 and wires 68 are encapsulated by an encapsulating mold material 70. A plurality of solder balls 62 are positioned on the solder ball lands 66 for electrical connection of the chip package 50 to a substrate such as a printed circuit board.

Figure 7A:
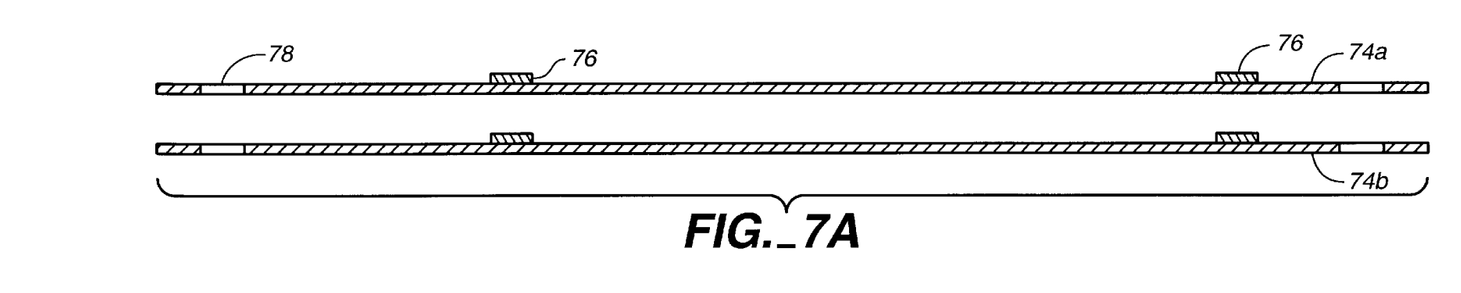
FIGS. 7A–7H are side cross-sectional views of the process for forming the semiconductor chip package of FIG. 6.
Figure 7B:
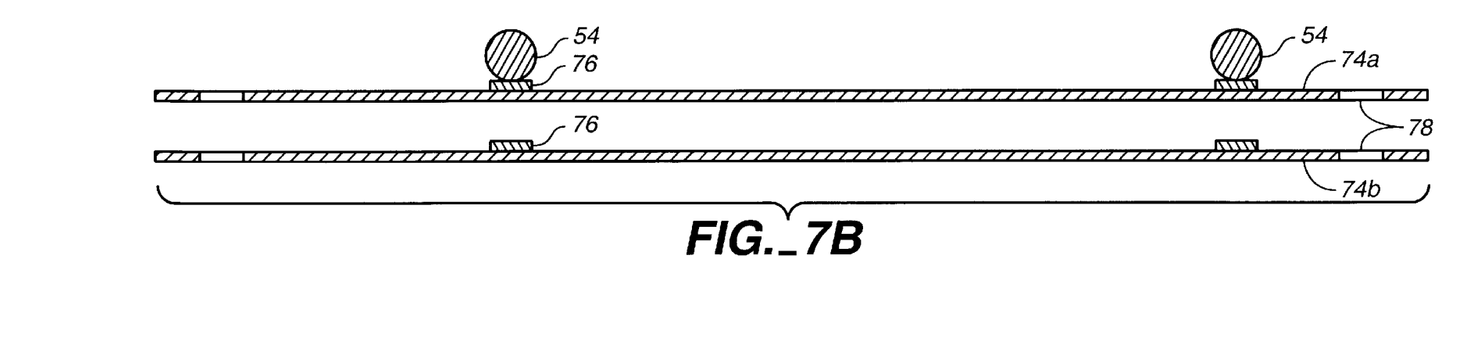
Figure 7C:
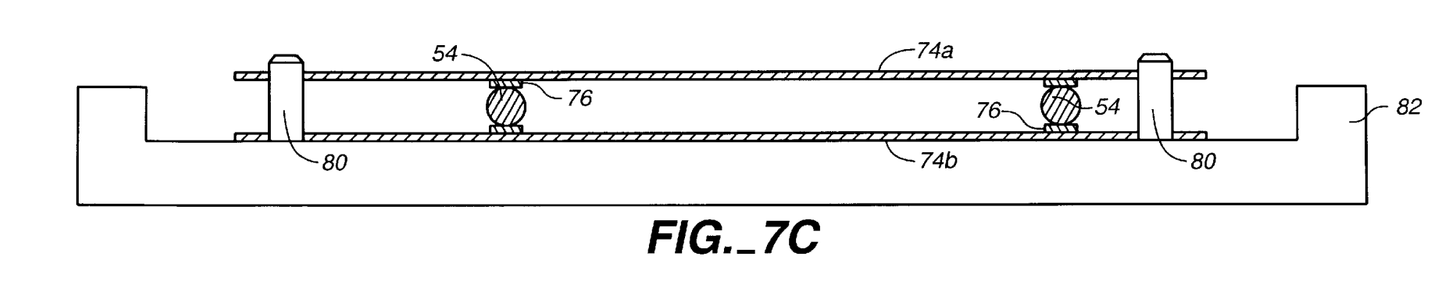

A step by step process of forming the chip package 50 is illustrated in FIGS. 7A–7H. In the first step of FIG. 7A, two thin sheets 74a, 74b of conductive material, such as copper foil are provided. The sheets 74a, 74b are cut with tooling holes 78 for later alignment inside a mold. A plurality of fast cure conductive adhesive pads 76 are placed on each of the sheets 74a, 74b at locations where the high temperature metal balls 54 will be placed. One example of a fast cure adhesive is fast cure silver epoxy which may be applied by a known method, such as screen printing, pin printing, or pneumatically dispensed by a needle. The high temperature metal balls 54 are then placed on the conductive adhesive pads 76 of one of the sheets 74 as shown in FIG. 7B. The adhesive pads 76 hold the metal balls 54 in place during molding of the substrate 52. The sheets 74a, 74b are arranged in a mold as shown in FIG. 7C with the metal balls 54 arranged between the two sheets and the tooling holes 78 aligned on alignment pins 80 of a bottom mold tool 82.

Figure 7D:
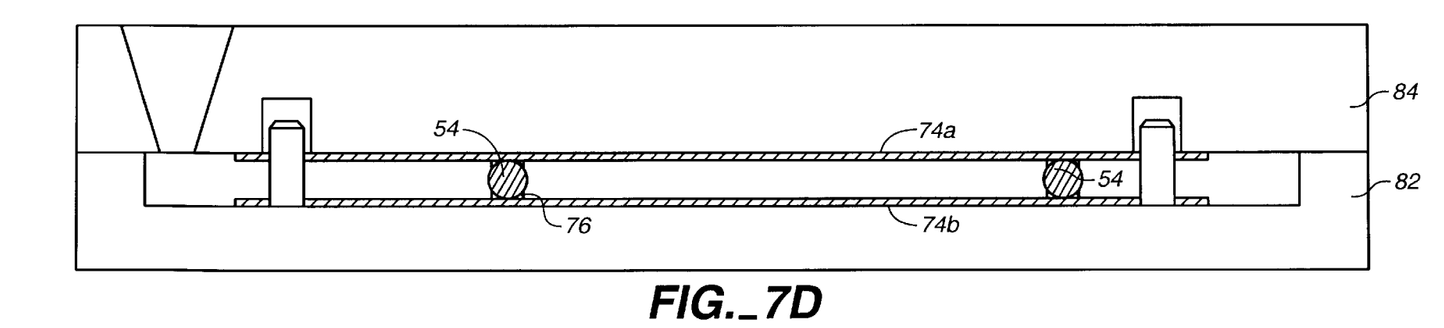

FIG. 7D illustrates the conductive sheets 74a, 74b and metal balls 54 arranged in the mold between a top mold tool 84 and bottom mold tool 82 in preparation for molding of the non-laminate substrate 52. When the top mold tool 84 is closed onto the bottom mold tool 82, the mold pressure causes the conductive adhesive pads 76 to deform around the metal balls 54. The metal balls 54 may also be slightly deformed or flattened by the mold pressure. The conductive adhesive pads 76 are preferably formed of a material which will cure when compressed in the mold without requiring a separate curing process. Alternatively, the conductive adhesive pads 76 may be formed of a material which required a separate curing operation after the mold has been closed.

Figure 7E:
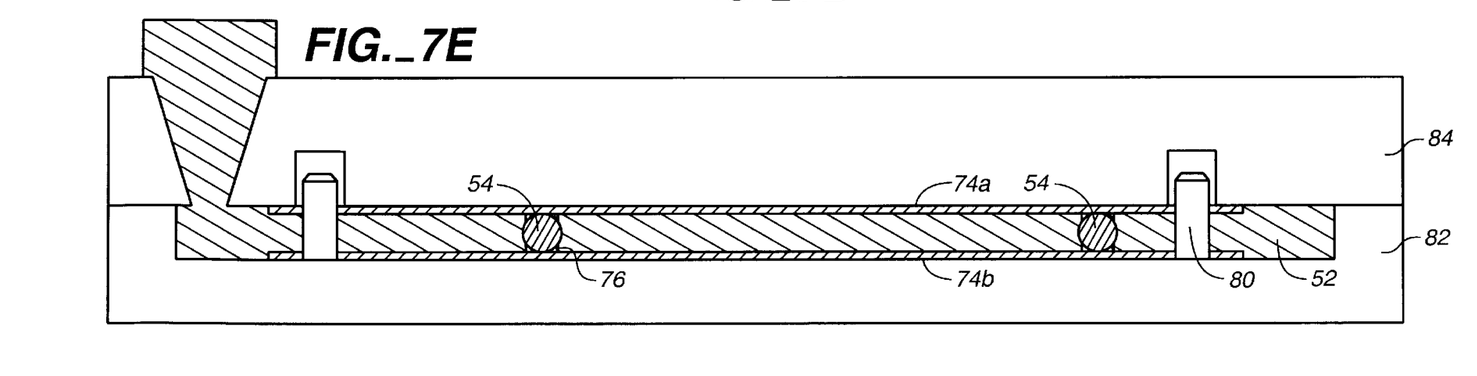

Once the mold has been closed over the conductive sheets 74a, 74b fixing the metal balls 54 between the conductive adhesive pads 76, the mold is filled with the mold material 52, as shown in FIG. 7E. The metal balls 54 hold the conductive sheets 74a, 74b firmly against the interior of the mold. The mold material 52 flows between the sheets 74a, 74b and around the plurality of metal balls 54 and presses the sheets 74a, 74b against the mold tool. Once the mold material 52 has cured, the metal balls 54 are surrounded by non-conductive mold material and provide an electrical connection between opposite sides of the mold material substrate 52.

The mold material includes resin, such as epoxy cresol novolac resin, phenol novolac resin, multifunctional epoxy resin, or the like. These mold material resins used in mold compounds are preferably specially formulated for moisture resistance. In contrast, resins used in laminate materials tend to absorb moisture faster than mold material resins. The mold material also includes a filler material, such as fused silica or quartz, in an amount between 50 and 90%, preferably 70–80%. Preferably the mold material includes 20–30% resin. The high temperature metal balls 54 are formed of conductive material such as solder, copper, iron, or the like, which will not melt at the mold temperatures or at the temperatures achieved during reflowing of the mounting solder balls 62. The melting temperature of the metal balls 54 is about 200° C. or higher, preferably 300° C. or higher.

Figure 7F:
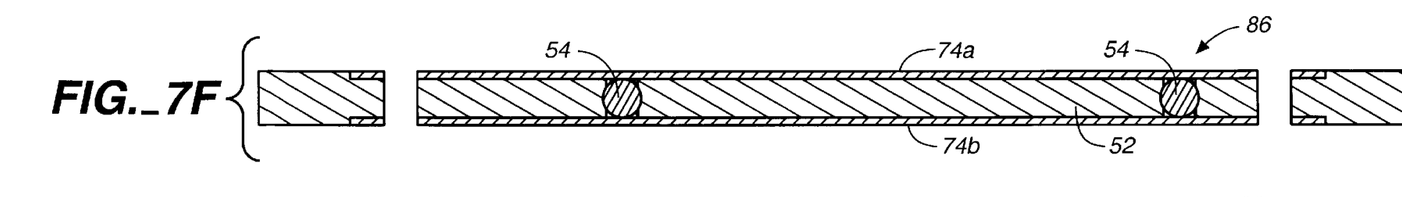
Figure 7G:
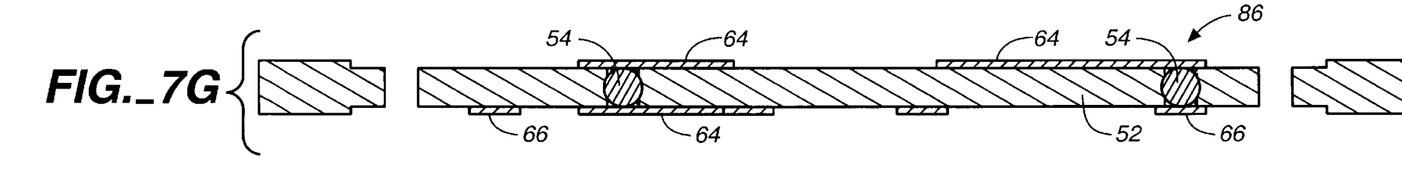

FIG. 7F illustrates a panel 86 which has been removed from the mold. The panel 86 includes the two sheets of conductive material 74a, 74b on either side of the mold material substrate 52 with the metal balls 54 encapsulated within the substrate. The panel 86 may be cut to a desired size as shown in FIG. 7F. The panel 86 is then etched on both sides to form patterns in the conductive material sheets 74a, 74b according to a known etching method as illustrated in FIG. 7G. The etched patterns include signal traces 64, bond fingers, and solder ball lands 66. The etching of the conductive sheets 74a, 74b may be performed before or after the trimming of the panel 86 to a desired size and shape.

Figures 7H, 8:
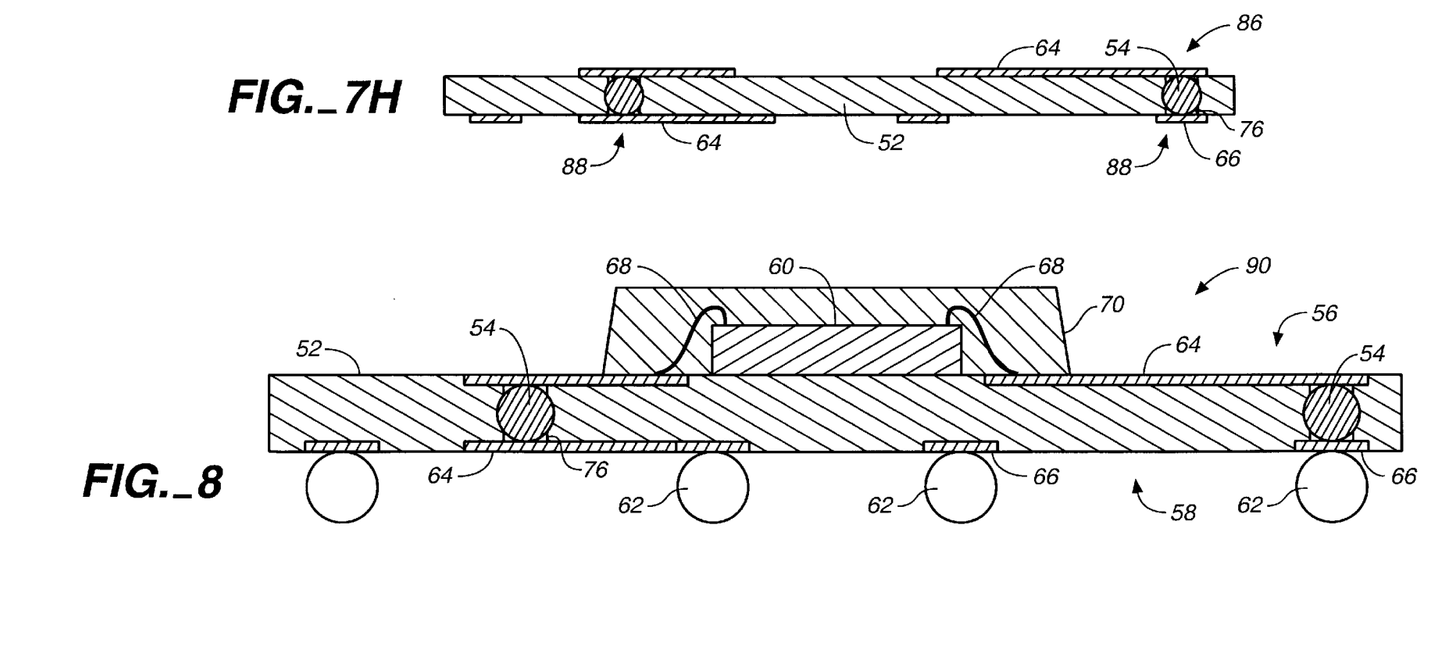
FIG. 8 is a side cross-sectional view of a semiconductor chip package according to an alternative embodiment of the invention.

The final panel 86, illustrated in FIG. 7H includes conductive columns 88 formed of the metal balls 54 and the conductive adhesive 76. These conductive columns 88 perform the functions of the via holes in the prior art packages. However, the conductive columns 88 provide an advantage over via holes because they allow a more compact arrangement of solder pads and traces on the surfaces of the substrate. The final package of FIG. 6 is formed from the panel of FIG. 7H by mounting the chip 60, connecting the wires 68 between the chip and the signal traces 64, and encapsulating the chip and wires with the encapsulating mold material 70.

The method described above and illustrated in FIGS. 6 and 7A–7H is a subtractive process since material is removed from the panel 86 by etching to form the pattern of signal traces 64 and solder ball lands 66. However, a non-laminate semiconductor package can also be formed by an additive process which is illustrated in FIGS. 8 and 9A–9I.

FIG. 8 shows a chip package 90 including a mold material substrate 52, a plurality of high temperature metal balls 54, a plurality of signal traces 64, and a plurality of solder ball lands 66. A chip 60 is mounted on a chip side 56 of the substrate and interconnected by a plurality of wires 68 to the signal traces 64. The chip 60 and wires 68 are encapsulated by an encapsulating mold material 70. A plurality of solder balls 62 are positioned on the solder ball lands 66 for electrical connection of the chip package 90 to a printed circuit board or other substrate.

Figure 9A:
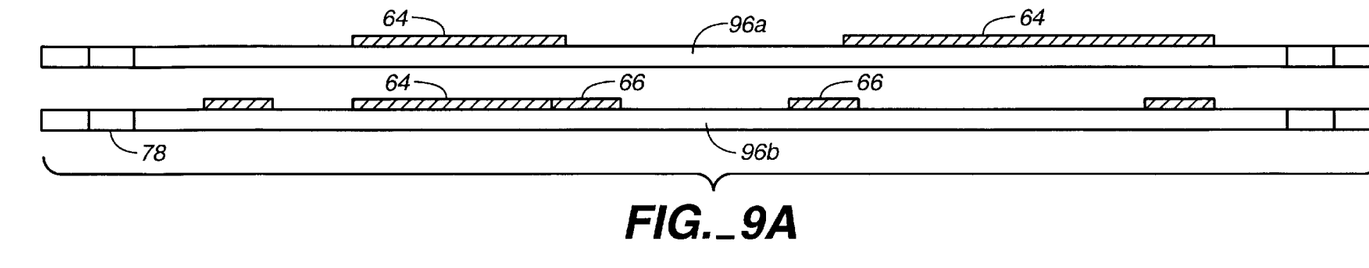
FIGS. 9A–9I are side cross-sectional views of a process for forming the semiconductor chip package of FIG. 8.
Figure 9B:
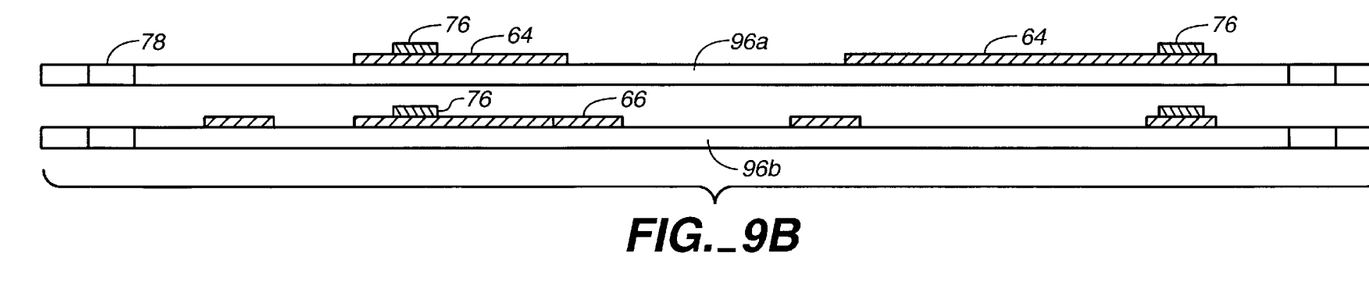

FIGS. 9A–9I illustrate a process of forming the chip package 90 by an additive process. In the first step of FIG. 9A, the signal traces 64 and solder ball lands 66 are pattern plated onto two thin carrier sheets 96a, 96b of an etchable material, such as copper or aluminum. Two alternative plating methods which may be use to form the patterned plates 96a, 96b of FIG. 9A are illustrated in FIGS. 10A and 10B.

Figure 10A:
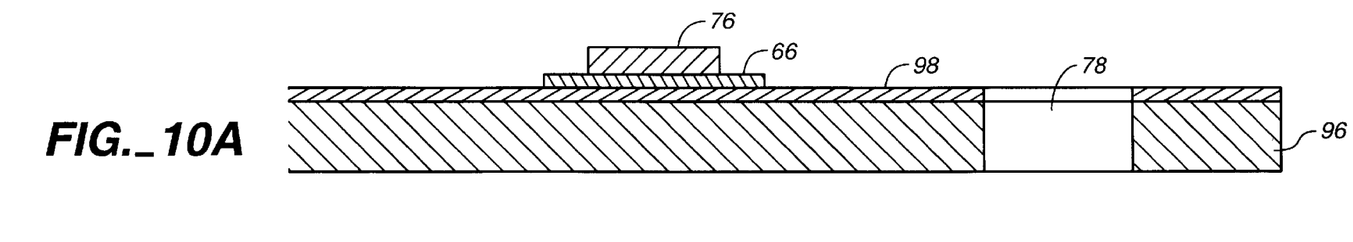
FIGS. 10A and 10B are side cross-sectional views of two different embodiments of patterning for use in the present invention.

FIG. 10A illustrates a carrier layer 96 of an etchable material such as copper having a etch resistant layer 98 plated on one entire surface of the carrier layer. The etch resistant layer 98 may be formed of any etch resistant conductive material, such as nickel. After formation of the etch resistant layer 98, a conductive material, such as copper, is pattern plated in a known manner onto the etch resistant layer in the pattern of the signal traces 64 and solder ball lands 66. A conductive adhesive 76 is then applied to the plated pattern at the locations where high temperature metal balls 54 will later be placed during assembly.

Figure 10B:
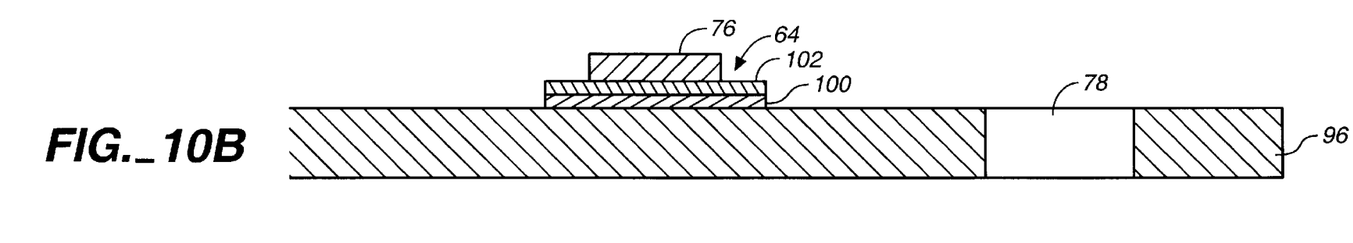

FIG. 10B illustrates an alternative configuration of a carrier layer 96 in which the carrier layer 96 is first pattern plated with an etch resistant material 100 and then pattern plated with a second conductive material 102 in the same pattern of the signal traces 64 and solder ball lands 66. The conductive adhesive 76 is then applied at the locations where the high temperature metal balls 54 are to be located.

Both of the carrier designs of FIGS. 10A and 10B provide the advantage of an additive patterning process which does not require etching to remove material between traces and thus, does not have the problem of undercutting on the sides of the traces which is prevalent in the prior art. These additive processes allow finer patterns and smaller package size. One example of an additive process for forming a single-sided substrate will be described below with respect to FIGS. 14A–14G.

Figure 9C:
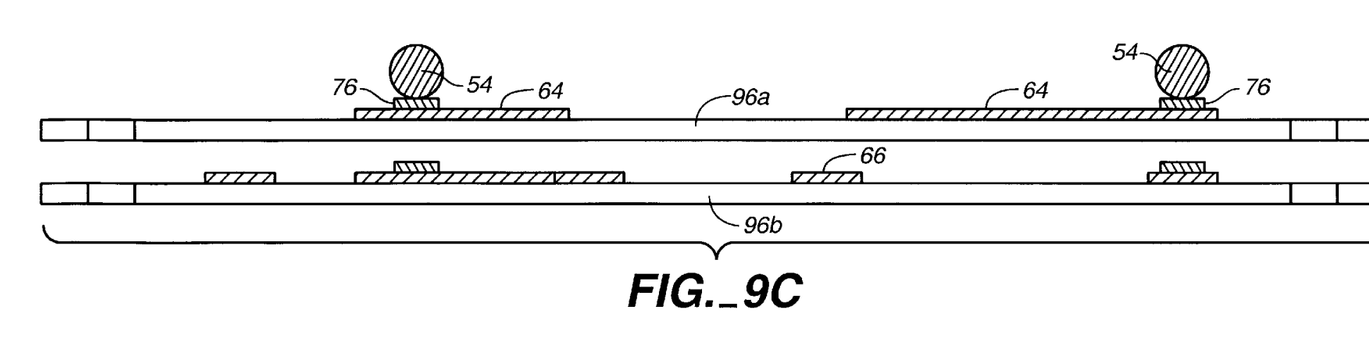

The signal traces 64 and solder ball lands 66 are formed on the two carrier sheets 96a, 96b by one of the methods described above with respect to FIGS. 10A and 10B. The fast cure conductive adhesive 76 is then applied to both sheets 96a, 96b and the high temperature metal balls 54 are positioned on the conductive adhesive pads on one of the sheets 96a, as shown in FIG. 9C. The sheets 96a, 96b are provided with tooling holes 78 for alignment inside the mold.

Figure 9D:
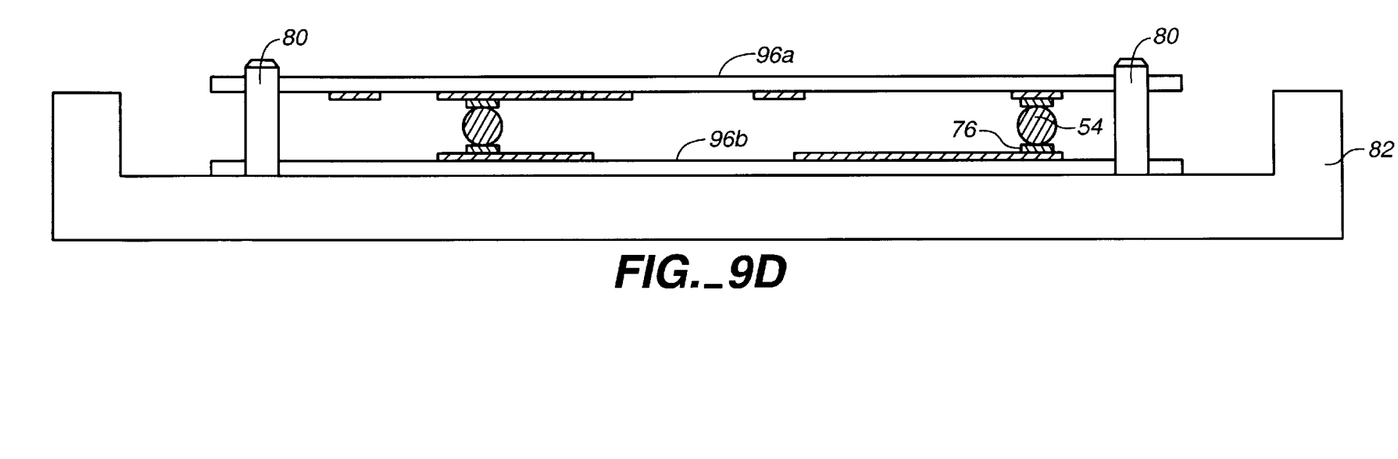
Figure 9E:
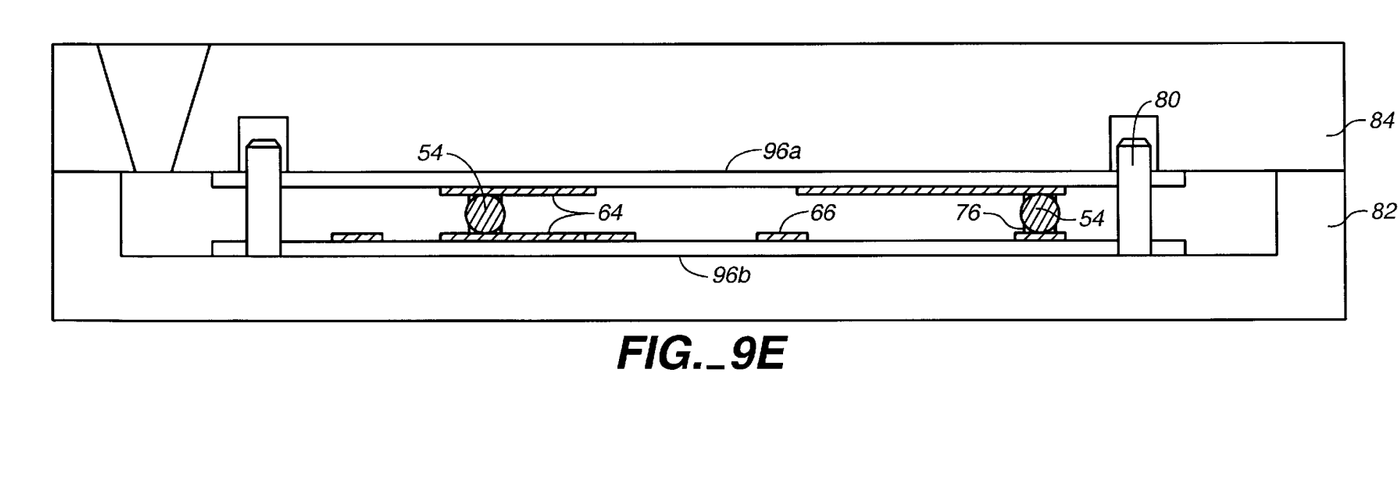

The sheets 96a, 96b are arranged in a mold as shown in FIG. 9D with the metal balls 54 arranged between the two sheets and the tooling holes 78 aligned on alignment pins 80 of a bottom mold tool 82. FIG. 9E illustrates the conductive sheets 96a, 96b and metal balls 54 arranged in the mold between a top mold tool 84 and bottom mold tool 82 in preparation for molding of the non-laminate substrate 52. When the top mold tool 84 is closed onto the bottom mold tool 84, the mold pressure causes the conductive adhesive pads 76 to deform around the metal balls 54. The conductive adhesive 76 then cures holding the metal balls 54 in place. The metal balls 54 may be slightly deformed or flattened by the mold pressure when the mold is closed. The metal balls 54 press the sheets 96a, 96b against the top and bottom of the mold.

Figure 9F:
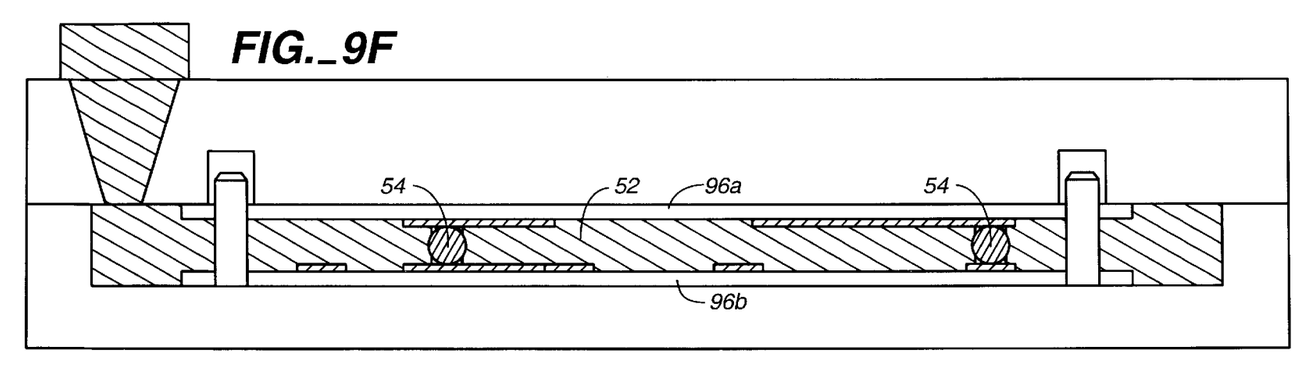
Figure 9G:
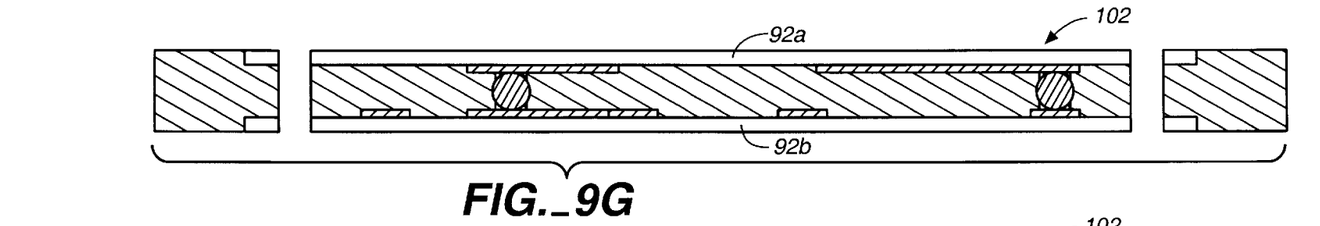
Figure 9H:
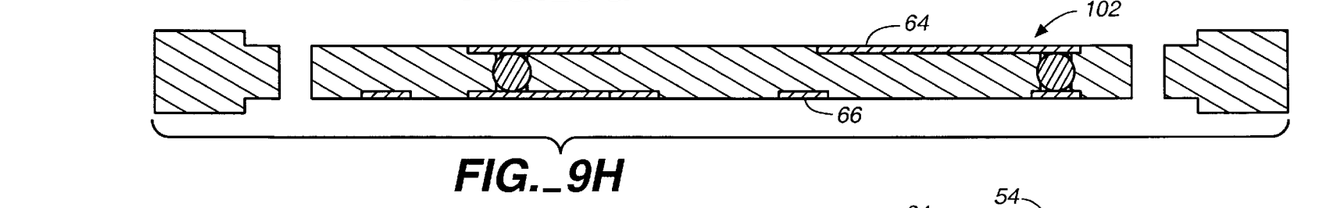

As shown in FIG. 9F, once the mold has been closed over the conductive sheets 96a, 96b fixing the metal balls 54 between the conductive adhesive pads 76, the mold is filled with the mold material 52. The mold material 52 flows between the sheets 96a, 96b and around the plurality of metal balls 54 to form a mold material substrate 52. A molded panel 102, shown in FIG. 9G, is removed from the mold and may be trimmed to a desired size and shape. The carrier sheets 96a, 96b are then etched away by a conventional etching process as shown in FIG. 9H. The etch resistant layer 98 or the etch resistant pattern 100 located between the traces and the carrier sheets 92a, 92b (FIGS. 10A and 10B), formed of a material such as nickel, prevent etching of the signal traces 64 and solder ball lands 66 when the carrier sheets are etched away.

Figure 9I:
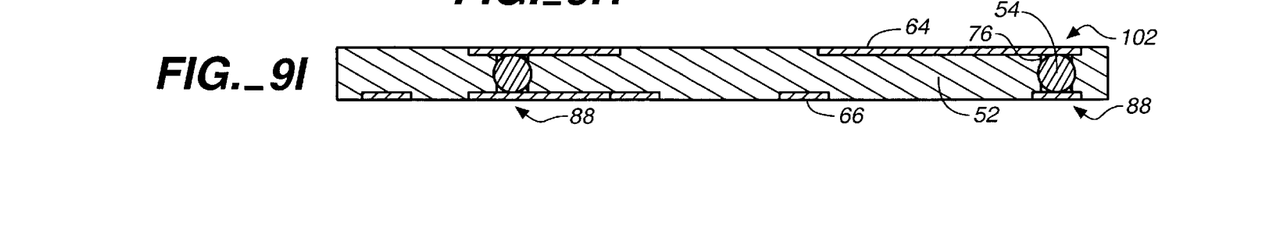

FIG. 9I shows the final panel 102 which is ready for chip mounting having conductive columns 88 molded into the mold material substrate 52 which take the place of via holes. The chip 60 is mounted and encapsulated in a conventional manner resulting in the completed non-laminate chip package illustrated in FIG. 8.

The advantages of the non-laminate chip packages of FIGS. 6 and 8 include finer lines, closer spacing, and lower cost. The finer lines and closer spacing result in more room on the package for routing. Another important advantage is the reduction in moisture absorption by the chip package due to the use of a substrate formed of a non-laminate mold material rather than a laminate material which tends to absorb moisture faster. Slower moisture absorption results in greater dimensional stability of the package. The mold material use in the present invention could not be used with conventional packages having via holes since the via holes must be drilled into the substrate and the mold material is too hard to be drilled. The invention also eliminates the need for the electroless plating process used to plate the via holes. The electroless process is undesirable due to the use of a formaldehyde bath.

Figures 11, 12:
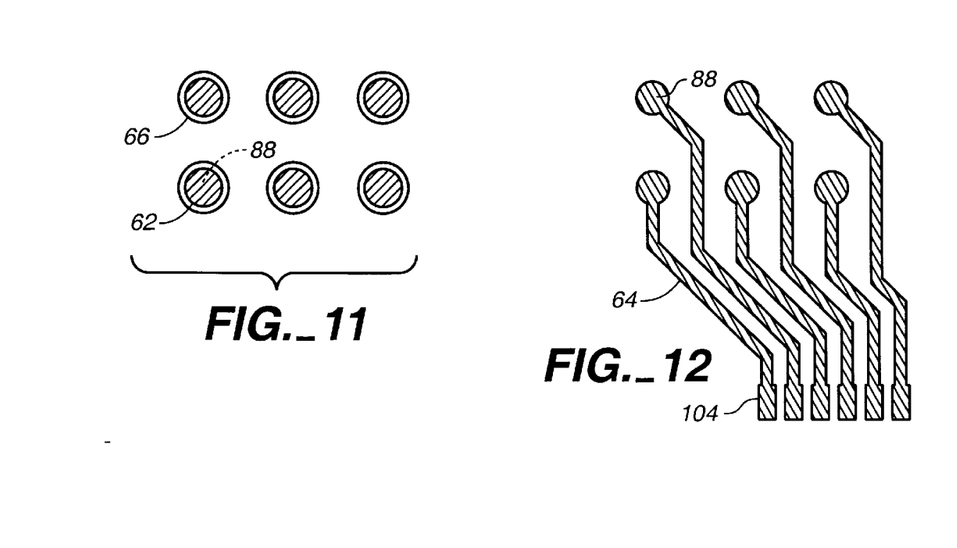
FIG. 11 is a bottom view of a portion of a package according to the present invention.
FIG. 12 is a top view of a portion of the package according to the present invention.
Figure 13:
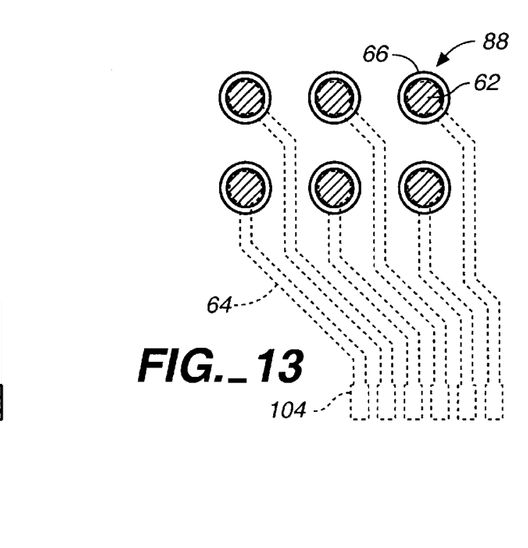
FIG. 13 is a superimposed view of FIGS. 11 and 12 showing the top and bottom of the package with a land on the top surface positioned directly over a solder ball on the bottom surface.

FIGS. 11–13 illustrate another advantage of the non-laminate semiconductor package. FIG. 11 is a bottom view of a portion of a package showing the solder balls 62 and solder ball lands 66 which are positioned directly on top of the conductive columns 88. FIG. 12 is a top view of a portion of the package having a plurality of signal traces 64 extending from the location of the conductive columns 88 to bonding pads 104. FIG. 13 is a super-imposed view of FIGS. 11 and 12 showing that there is no offset needed between the solder ball lands 66 and the conductive columns 88. When compared to the prior art package shown in FIGS. 2–4, the package according to the present invention provides the advantage of less complex and smaller patterns on both sides of the substrate.

FIGS. 14A–14G illustrate an additive process for forming patterns on a semiconductor chip package. The additive process provides improve precision of pattern formation over the known processes. The increased precision allows finer lines and closer spacing of lines in the package. The additive process may be used to form single sided packages such as the package illustrated in FIG. 14G or double sided packages such as the package of FIG. 8.

Figure 14A:
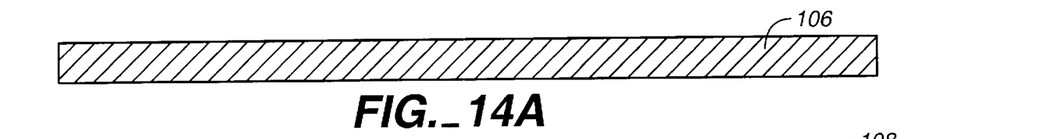
FIGS. 14A–14G are side cross-sectional views of the process for forming a semiconductor chip package according to an alternative embodiment of the invention.
Figure 14B:
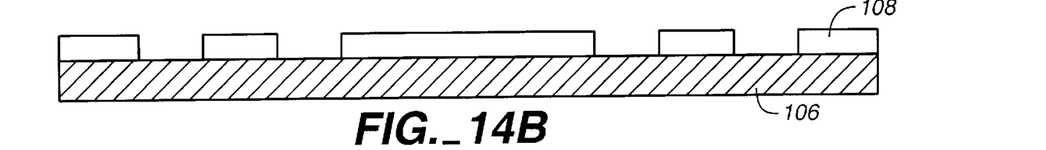
Figure 14C:
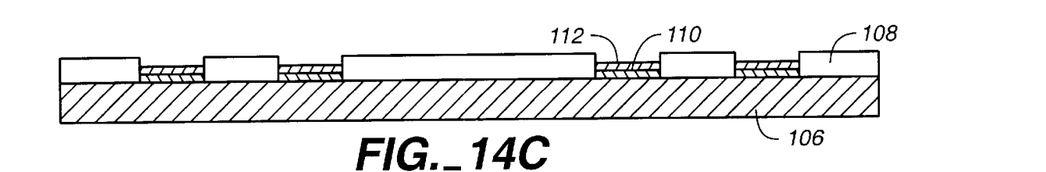
Figure 14D:
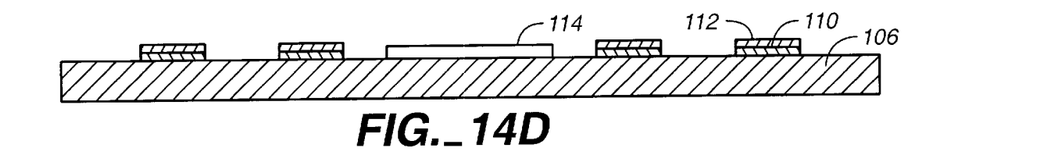

According to the additive process, an etchable carrier sheet 106, such as a copper carrier, is provided as shown in FIG. 14A. A photo resist 108 is applied to the carrier sheet 106 by the known process including masking, exposing, and developing. The photo resist 108 covers the carrier sheet 106 leaving spaces with no photo resist at the locations where signal traces, solder ball lands, or bonding pads will be formed on the carrier. FIG. 14C illustrates the carrier sheet 106 after a layer of etch resistant material 110 and a layer of conductive material 112 have been applied to the carrier in the spaces where there is no photo resist 108. The photo resist 108 is then stripped away leaving the two layer traces and solder ball lands on the surface of the carrier sheet 106, as shown in FIG. 14D. An optional solder mask 114 may be applied to a portion of the carrier sheet 106 to provide a base for attachment of the electronic component or chip 116.

Figure 14E:
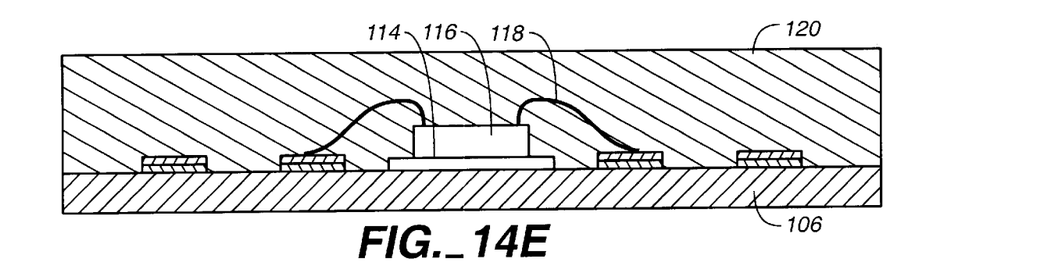

As shown in FIG. 14E, the chip 116 is attached to the solder mask 114 and connected by wires 118 to the traces. The chip 116 and layered traces are then entirely encapsulated in mold material 120 by placing the carrier sheet 106 inside a mold. In the final steps of FIGS. 14F and 14G, the carrier sheet 106 is stripped away and solder balls 122 are formed on the solder pads for attachment of the chip package to a substrate such as a printed circuit board.

Figure 14F:
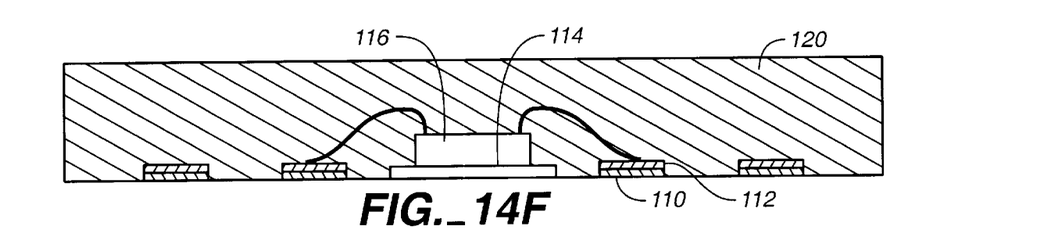
Figure 14G:
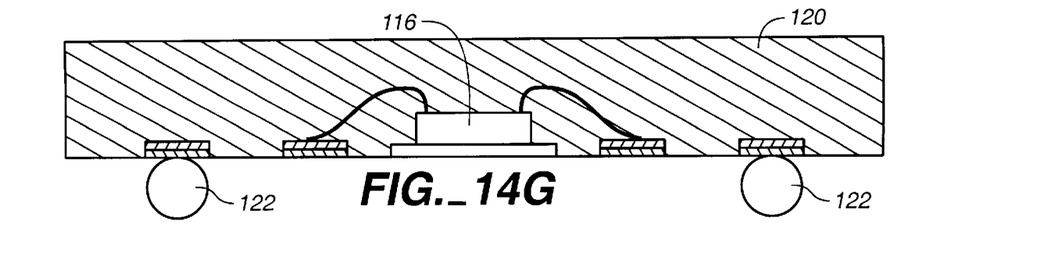

The etching to remove the carrier sheet 106 may be copper chloride etching, ammonium chloride etching, ferric chloride etching, a slow etching process, or any other known etching process. The layer of etch resistant material 110 of each of the traces prevents the etching process by which the carrier sheet is removed from destroying the traces and solder pads of the package. The resulting package is compact, durable, stable, and resistant to moisture.

For some applications it is desirable to provide a precious metal bonding surface, such as a gold layer for bonding the wires 118. A precious metal bonding surface may be applied over the conductive layer of copper 112 in the step illustrated in FIG. 14C. A separating layer such as nickel will preferably be positioned between the copper and the gold. The wires 118 are then bonded directly to the precious metal layer.

The materials described above for use in the non-laminate semiconductor packages are merely examples of materials which may be used. Other materials now known or later developed may also be used.

While the invention has been described in detail with reference to the preferred embodiments thereof, it will be apparent to one skilled in the art that various changes and modifications can be made and in equivalents employed without departing from the present invention.

What is claimed is:

1. A semiconductor device comprising:
    a carrier substrate having a first surface for attachment of a chip and a second surface opposite the first surface for mounting the carrier substrate, the carrier substrate molded of a non-laminate material;
    a plurality of conductive metal balls molded within the carrier substrate, the metal balls each providing an electrical connection between the first surface and the second surface;
    a plurality of signal traces on the first surface electrically connected to the metal balls;
    a plurality of solder pads on the second surface electrically connected to the metal balls; and
    a chip mounted on the first surface and electrically connected to the plurality of signal traces.

2. The semiconductor device according to claim 1, wherein each of the plurality of metal balls is compressed between two pads of conductive adhesive.

3. The semiconductor device according to claim 1, wherein the metal balls are high temperature metal balls which melt at temperatures above about 220° C.

4. The semiconductor device according to claim 1, wherein the carrier substrate includes resin and 50 percent or more of a filler material.

5. The semiconductor device according to claim 1, wherein the carrier substrate includes a resin and 70 percent or more of a filler material.

6. The semiconductor device according to claim 1, wherein the plurality of metal balls are mounted between pads of conductive adhesive.

7. A semiconductor package comprising:
- a carrier substrate having a first surface for attachment of a chip and a second surface opposite the first surface, the carrier substrate formed of a mold material;
- a plurality of conductive columns molded within the carrier substrate to provide an electrical connection between the first surface and the second surface;
- a chip mounted on the first surface and electrically connected to the conductive columns; and
- a plurality of connecting members on the second surface electrically connected to the conductive columns for electrically mounting the package.

8. The semiconductor package according to claim 7, wherein the plurality of conductive columns each include a metal ball mounted between two pads of conductive adhesive.

9. The semiconductor package according to claim 8, wherein the metal ball is formed of solder, copper, or iron.

10. The semiconductor package according to claim 7, wherein the conductive columns are solid columns formed of a conductive material with a melting point above 220° C.

11. The semiconductor package according to claim 7, wherein the carrier substrate is formed of a molded material including a resin and 50 percent or more of a filler material.

* * * * *